United States Patent [19]
Hoshino

[11] Patent Number: 5,963,096
[45] Date of Patent: Oct. 5, 1999

[54] AMPLIFIER CIRCUIT

[75] Inventor: Koichi Hoshino, Tokyo, Japan

[73] Assignee: NEC Corporation, Tokyo, Japan

[21] Appl. No.: 08/917,766

[22] Filed: Aug. 27, 1997

[30] Foreign Application Priority Data

Aug. 29, 1996 [JP] Japan ................................. 8-228004

[51] Int. Cl.$^6$ ................................. H03F 3/04; H03F 1/30
[52] U.S. Cl. ..................... 330/296; 330/290; 330/288
[58] Field of Search ................................. 330/311, 296, 330/290, 288, 98, 99, 100

[56] References Cited

U.S. PATENT DOCUMENTS 4,663,599  5/1987  Patch ................................. 330/311

FOREIGN PATENT DOCUMENTS 49-17655  of 1974  Japan .
50-129041  3/1974  Japan .
2-72705  3/1990  Japan .

Primary Examiner—Robert Pascal
Assistant Examiner—Patricia T. Nguyen
Attorney, Agent, or Firm—Foley & Lardner

[57] ABSTRACT

An amplifier circuit can operate stably without increasing a consumed current even when a direct current amplification of a transistor is fluctuated due to tolerance in manufacturing process. The amplifier circuit has a first transistor having an emitter grounded. A second transistor has an emitter connected to a collector of said first transistor and a collector connected to a power source via a load and a first bias resistor circuit network. A third transistor constructs a current mirror circuit together with said first transistor and receives a bias current via a second bias resistor circuit network. The second bias resistor circuit network has a power source side terminal connected to a junction point between said load and said first bias resistor circuit network.

5 Claims, 3 Drawing Sheets

AMPLIFIER CIRCUIT

BACKGROUND OF THE INVENTION

1. Field of the Invention

The present invention relates generally to an amplifier circuit. More specifically, the invention relates to an amplifier circuit including a bipolar transistor connected in cascode.

2. Description of the Related Art

In an application requiring amplification in a wide band at high frequency, such as an RF (Radio Frequency) receiver circuit of a moving body in a mobile communication, for example, amplifier circuits employing transistors connected in cascode have been employed frequently.

FIG. 2 is a circuit diagram of a typical amplifier circuit employing cascode connected transistors. The amplifier circuit as illustrated in FIG. 2 is called as a negative feedback type amplifier circuit (hereinafter referred to as "first prior art"). As shown in FIG. 2, a base of a first transistor Q1 is connected to an input terminal 1 and an emitter is grounded. A collector of the transistor Q1 is connected to an emitter of a second transistor Q2. A collector of the second transistor Q2 is connected to an output terminal 2, and in conjunction therewith, to a power source Vcc via a load Z1, resistors R12 and R11. The base of the second transistor Q2 is connected to a junction point between the resistors R11 and R12, and, in conjunction therewith, to the ground via a capacitor C. On the other hand, the base of the first transistor Q1 is connected to a junction point between the load Z1 and the resistor R12 via a feedback resistor R13.

In this circuit, a negative feedback is applied to the base of the first transistor Q1 via the resistor R13 so as to stabilize circuit operation.

FIG. 3 is a circuit diagram showing an amplifier with a cascode connected transistors, called as a current mirror type amplifier circuit (hereinafter referred to as "second prior art"). In this prior art, bias current is stabilized using a current mirror circuit. As shown in FIG. 3, a base of a first transistor Q1 is connected to an input terminal 1, and an emitter is grounded. A collector of the first transistor Q1 is connected to an emitter of a second transistor Q2. A collector of the second transistor Q2 is connected to an output terminal 2 and to a power source Vcc via a load Z1. A base of the second transistor Q2 is connected to the power source Vcc via a resistor R21 and grounded via a capacitor C.

The emitter of the first transistor Q1 and an emitter of a third transistor Q3 forming a current mirror circuit are grounded. The collector of the third transistor Q3 is connected to the power source Vcc via a resistor R22. A collector and a base of the third transistor Q3 are connected via resistors R23 and R24. A junction between the resistors R23 and R24 is connected to the base of the first transistor.

In the shown circuit, by bias resistors R22 to R24, a current flowing through a current mirror circuit, namely a collector current Ic of the first transistor Q1, is stabilized. Then, feedback of FIG. 2 in which a bias current of the amplifier circuit is supplied using the current mirror circuit, is not employed to enable driving at lower voltage than the circuit of FIG. 2.

In the circuit employed in the moving body of the mobile communication and so forth, it has been demanded to lower a driving voltage down to a voltage near an extreme, e. g. approximately 1 V for low driving voltage and low power consumption. If lowering of driving voltage and reduction of power consumption are introduced into the prior art set forth above, stable circuit operation cannot be assured. For instance, if fluctuation is caused in direct current amplification $h_{FE}$ of the transistor due to fluctuation in the manufacturing process, significant fluctuation is caused in the collector current Ic flowing through the circuit due to lowering of voltage and lowering of current.

In the circuit of the first prior art shown in FIG. 2, it becomes necessary to increase feedback amount to the base of the first transistor Q1 in order to stabilize the circuit operation. For achieving this, it becomes necessary to increase the collector current Ic or to increase resistance of the resistors R11 and R12. When higher resistance is provided for the resistors R11 and R12, higher power source voltage becomes necessary. This is contradictory to the demand for lower current and lower voltage.

In case of the circuit of the second prior art shown in FIG. 3, an attempt for establishing stability of operation of the current mirror circuit constructed with the transistors Q3 and Q1, is made by employing the bias resistors R22 to R24. However, in order to operate the circuit stably with respect to fluctuation of the direct current amplification $h_{FE}$, for example, a current higher than or equal to a predetermined current has to be applied to the third transistor Q3. Increasing the current of the third transistor which does not directly contribute to amplifying operation of the circuit, is not desirable for increasing of current consumption.

SUMMARY OF THE INVENTION

The present invention has been worked out for solving the problems set forth above. Therefore, it is an object of the present invention to provide an amplifier circuit which has high stability against fluctuation of direct current amplification $h_{FE}$ of a transistor or so forth due to tolerance in a manufacturing process, and permits low voltage operation with low power consumption.

The foregoing object of the present invention can be accomplished by supplying a bias current of an amplifier of cascode connection to a current mirror circuit for applying a feedback to the current mirror circuit from the cascode connected current amplifier circuit.

Therefore, an amplifier circuit, according to the present invention, comprises:

a first transistor having an emitter grounded;

a second transistor having an emitter connected to a collector of the first transistor and having a collector connected to a power source via a load and a first bias resistor circuit network;

a third transistor constructing a current mirror circuit together with the first transistor and receiving supply of a bias current via a second bias resistor circuit network; and the second bias resistor circuit network having a power source side terminal connected to a junction point between the load and the first bias resistor circuit network.

In the construction set forth above, the first bias resistor network may be constructed with a first resistor connected between a base of the second transistor and the power source and a second resistor connected between a base of the second transistor and the load.

Also, the second bias resistor network may be constructed with a third resistor connected between a junction point between the second resistor and the load and a collector of the third transistor, a fourth resistor connected between a collector of the third transistor and the base of the first transistor, and a fifth resistor connected between a base of the third transistor and the base of the first transistor.

A ratio S1/S2 of a size S1 of the first transistor and a size S2 of the third transistor may be sufficiently larger than one.

The base of the second transistor may be grounded via a capacitor.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
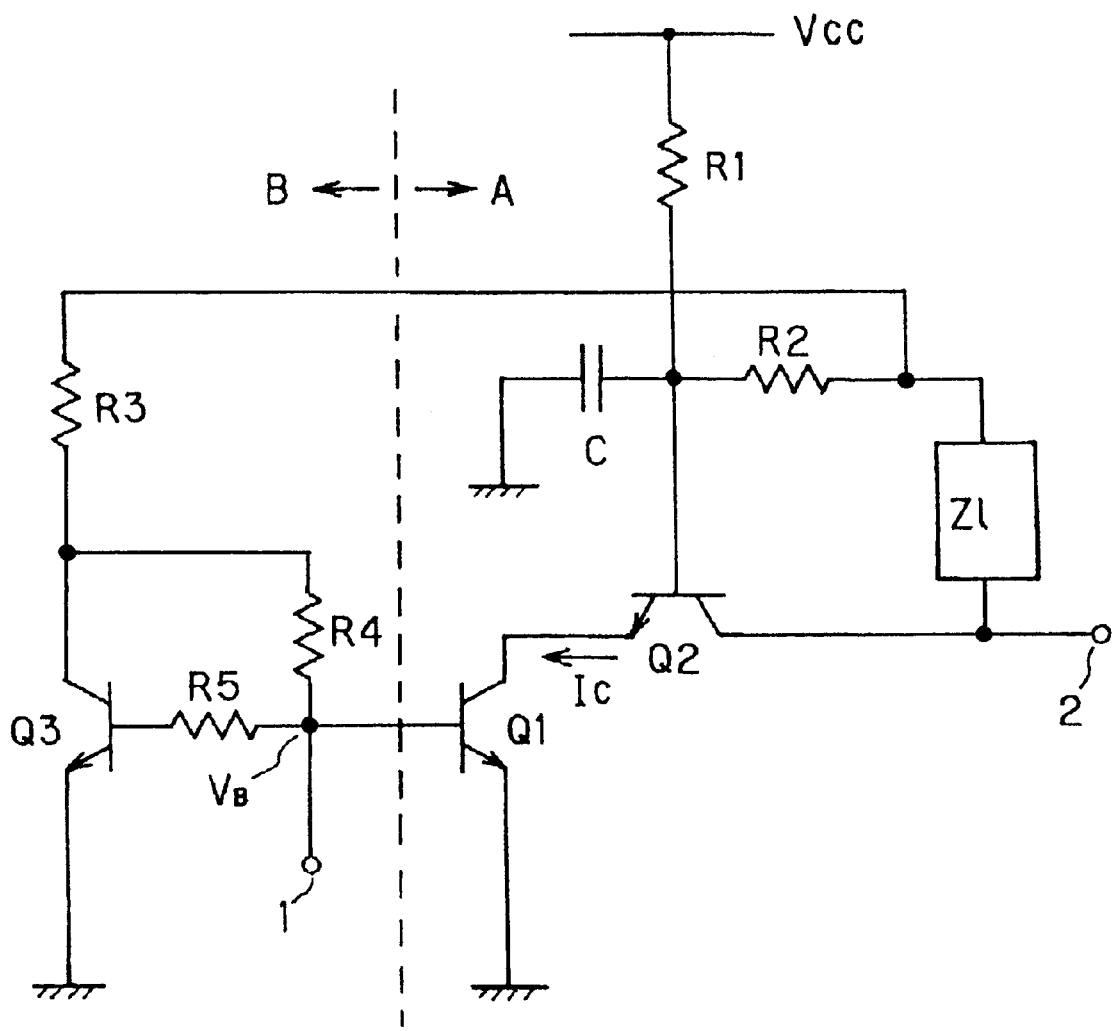
FIG. 1 is a circuit diagram showing one embodiment of an amplifier circuit according to the present invention.
Figure 2:
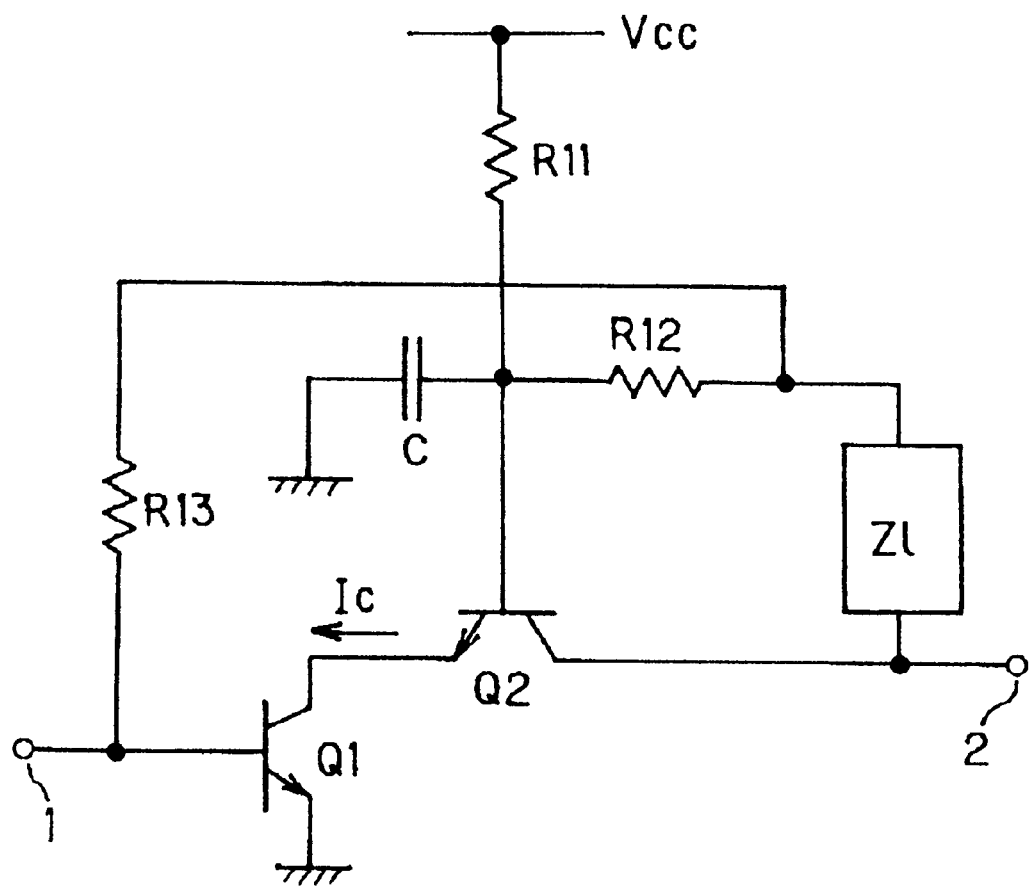
FIG. 2 is a circuit diagram of the conventional amplifier circuit called as a negative feedback type amplifier circuit.
Figure 3:
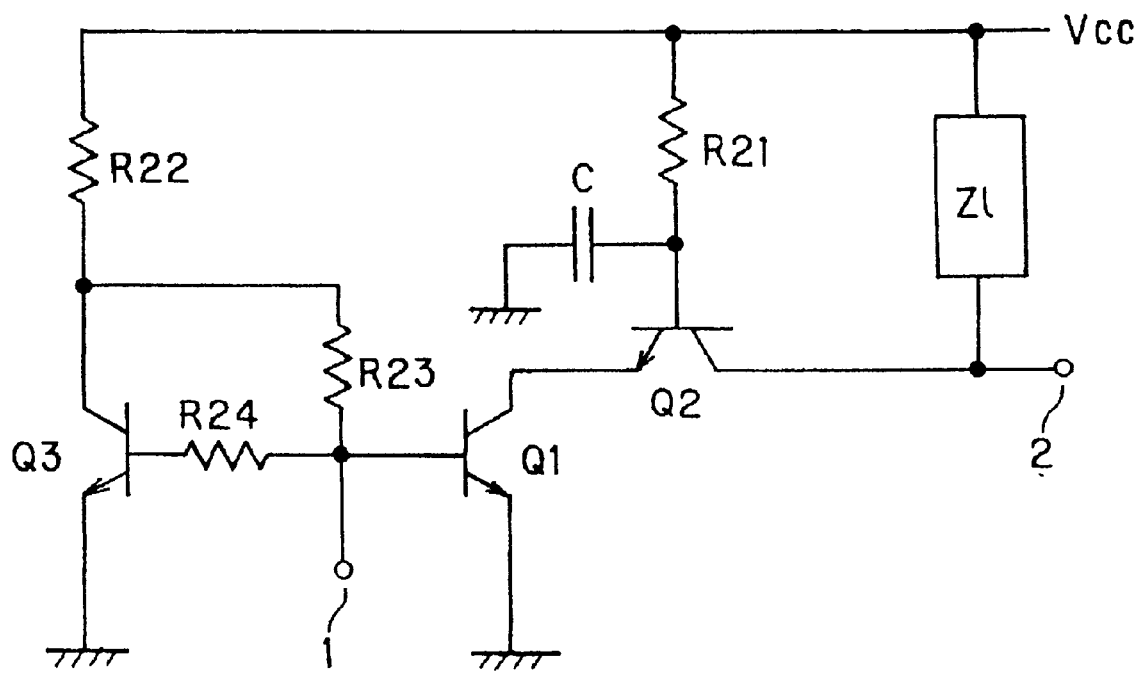
FIG. 3 is a circuit diagram showing the conventional amplifier circuit called as a current mirror type amplifier circuit.

FIG. 1 is a circuit diagram of the preferred embodiment of an amplifier circuit according to the present invention. The amplifier circuit shown in FIG. 1 is constructed with a cascode connected amplifier circuit portion A and a current mirror bias circuit portion B.

In the cascode connected amplifier circuit A, a collector of a first transistor Q1 which has a base connected to an input terminal 1, is connected to an emitter of a second transistor Q2 which has a collector connected to an output terminal 2. The emitter of the first transistor Q1 is grounded. The collector of the second transistor Q2 is connected to the base of the second transistor Q2 via a load Z1 and a feedback resistor R2. On the other hand, the base of the second transistor Q2 is connected to a power source Vcc via a resistor R1 and grounded via a capacitor C.

The current mirror type bias circuit portion B is constructed with a third transistor Q3, and resistors R3, R4, R5. An emitter of the third transistor Q3 is grounded. A base of the third transistor Q3 is connected to the base of the first transistor Q1 of the cascode connected amplifier circuit portion A via resistor R5. A collector of the third transistor Q3 is connected to a junction point between the feedback resistor R2 and the load Z1 via a resistor R3, and to the base of the first transistor Q1 via the resistor R4.

Next, operation of the preferred embodiment of the amplifier circuit according to the present invention will be discussed.

At first, discussion will be given with respect to DC feedback. A circuit current of the amplifier circuit of FIG. 1 is determined by a base potential of the first transistor Q1. The base potential of the first transistor Q1 is assumed as $V_B$, a collector current of the first transistor Q1 is assumed as Ic, the size of the first transistor Q1 and the third transistor Q3 are assumed to have a relationship of Q1:Q3=N:1. The base current is ignoreably small in comparison with the collector current, and N>>1 is established. Then, the base potential $V_B$ can be approximately expressed by the following equation (1).

$$V_B=Vcc-(R1+R2)IC-R3\cdot Ic/N=VCC-(R1+R2+R3/N)IC \quad (1)$$

Accordingly, when the circuit current (collector current) is increased, $V_B$ becomes smaller to act for lowering the circuit current. Conversely, when the circuit current is lowered, $V_B$ becomes greater to act for elevating the circuit current.

Next, discussion will be given with respect to the operation of the current mirror portion. Now, it is assumed that the direct current amplification $h_{FE}$ becomes too low due to tolerance in the manufacturing process. Then, the collector current of the third transistor Q3 is lowered to increase the base current. When the base current of the third transistor Q3 is increased, the base potential $V_B$ of the first transistor Q1 is elevated due to voltage drop by the resistor R5 to increase Ic for compensating lowering of the direct current amplification $h_{FE}$. When the direct current amplification $h_{FE}$ becomes too high due to tolerance in manufacturing process, the base potential $V_B$ is lowered to decrease Ic.

In the shown circuit, by connecting the bias circuit (R3 to R5) of the third transistor Q3 to the junction point between the load Z1 and the resistor R2 for applying feedback, stable operation becomes possible without applying large current to the third transistor Q3.

As set forth above, the amplifier circuit, according to the present invention is designed to apply the negative feedback from the cascode connected amplifier circuit to the bias circuit of the current mirror circuit which supplies the bias current to the cascode connected amplifier circuit. Therefore, effects of both of the negative feedback and base compensation resistance can be utilized. Therefore, the amplifier circuit which can stably operate at low driving voltage and low power consumption.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An amplifier circuit comprising:

a first transistor having an emitter grounded;

a second transistor having an emitter connected to a collector of said first transistor and having a collector connected to a power source via a load and a first bias resistor circuit network;

a third transistor constructing a current mirror circuit together with said first transistor and receiving supply of a bias current via a second bias resistor circuit network; and said second bias resistor circuit network having a power source side terminal connected to a junction point between said load and said first bias resistor circuit network.

2. An amplifier circuit as set forth in claim 1, wherein said first bias resistor network is constructed with a first resistor connected between a base of said second transistor and said power source and a second resistor connected between a base of said second transistor and said load.

3. An amplifier circuit as set forth in claim 2, wherein said second bias resistor network is constructed with a third resistor connected between a junction point between said second resistor and said load and a collector of said third transistor, a fourth resistor connected between a collector of said third transistor and the base of said first transistor, and a fifth resistor connected between a base of said third transistor and the base of said first transistor.

4. An amplifier circuit as set forth in claim 1, wherein a ratio S1/S2 of a size S1 of said first transistor and a size S2 of said third transistor is sufficiently larger than one.

5. An amplifier circuit as set forth in claim 1, wherein the base of said second transistor is grounded via a capacitor.

* * * * *